United States Patent [19]
Canale et al.

[11] Patent Number: 5,789,324
[45] Date of Patent: Aug. 4, 1998

[54] UNIFORM GAS FLOW ARRANGEMENTS

[75] Inventors: Anthony John Canale, Essex Junction; Randy Dean Cox, Burlington; Dennis Stanley Grimard, Williston; Tracy Charles Hetrick, Milton, all of Vt.

[73] Assignee: International Business Machines Corporation, Armonk, N.Y.

[21] Appl. No.: 820,295

[22] Filed: Mar. 18, 1997

Related U.S. Application Data

[62] Division of Ser. No. 401,641, Mar. 7, 1995, Pat. No. 5,639,334.

[51] Int. Cl.$^6$ .................................................. H01L 21/302
[52] U.S. Cl. .......................... 438/714; 438/716; 438/935; 427/9; 204/298.15; 204/298.07; 204/298.33
[58] Field of Search .......................... 156/345; 438/714, 438/716, 935; 427/9; 204/298.07, 298.15, 298.31, 298.33; 216/65, 66, 67

[56] References Cited

U.S. PATENT DOCUMENTS

| | | | |
|---|---|---|---|
| 3,745,969 | 7/1973 | Huffman et al. | 118/730 |
| 4,512,841 | 4/1985 | Cunningham, Jr. et al. | 204/298.31 |
| 5,271,788 | 12/1993 | Hasegawa et al. | 204/298.31 |
| 5,552,017 | 9/1996 | Jang et al. | 438/935 |
| 5,620,576 | 4/1997 | Wordenweber | 204/298.15 |

*Primary Examiner*—R. Bruce Brenean
*Assistant Examiner*—Anita Alanko
*Attorney, Agent, or Firm*—James M. Leas

[57] ABSTRACT

A uniform gas flow is provided at the surface of a planar device or wafer in a processing system having a substantially cylindrical chamber through which processing gases flow toward an asymmetrically located outlet port by using an appropriately disposed collar or baffle along the gas stream in the chamber in the plane of the surface of the planar device or wafer.

10 Claims, 3 Drawing Sheets

UNIFORM GAS FLOW ARRANGEMENTS

This application is a division of application Ser. No. 08/401,641 filed Mar. 7, 1995 which application is now U.S. Pat. No. 5,639,334.

TECHNICAL FIELD

This invention relates to a gas flow system wherein an even distribution of gas is directed at the surface of a device being processed within a chamber of the system, and more particularly at the surface of a semiconductor wafer disposed within a reactive ion etching (RIE) tool.

BACKGROUND ART

A uniform gas flow is often desired across the surface of a device being processed. In many instances a uniform gas flow over an entire surface of a device is difficult to achieve because of, e.g., structural irregularities or asymmetries, such as an off center pump port, in the chamber of the gas flow system in which the device is contained. In the semiconductor technology, a uniform gas flow is required in a system for processing a semiconductor wafer at the surface of the wafer even though the chamber of the system containing the wafer includes asymmetrically arranged elements therein located between the gas inlet and the gas outlet which cause disturbances in the flow of the gas in the chamber. In many commonly used semiconductor wafer processing systems, the chamber is designed so that even though a processing gas is introduced uniformly into the chamber and directed at the surface of a wafer, disturbances are created by an asymmetrically positioned exhaust pump port or outlet or by other required structure in the chamber.

In view of the very high density of elements, such as transistors, formed in today's semiconductor wafers, which now includes more than 16 million memory cells in a single semiconductor chip diced from a wafer, it can be seen that a highly uniform gas flow is required over the surface of the wafer, e.g., in an etching process, in order to obtain satisfactory processing yields. This uniform gas flow is particularly important when a uniform layer, e.g., a polysilicon layer having a thickness of 2,000 Angstroms or less, deposited on the wafer must be selectively etched across the entire surface of the wafer without disturbing an underlying thin layer, e.g., a layer of silicon nitride, to produce the many devices formed in the wafer with the same electrical characteristics, particularly since today's semiconductor wafers may have an eight inch or larger diameter.

In U.S. Pat. No. 4,780,169 by M. K Stark et al, which issued on Oct. 25, 1988, there is disclosed a reaction chamber of a dry etching apparatus including a gas inlet having a non-uniform array of inlets for a non-uniform introduction of an etching gas to compensate for non-uniformity characteristics of the apparatus to provide a uniform etch in a substantially symmetrical chamber. Also, U.S. Pat. No. 4,297,162 by R. S. Mundt et al, which issued on Oct. 27, 1981, discloses the use of a curved electrode in a symmetrical chamber through which reactant gases pass to a semiconductor slice, the curved electrode being closer to the slice at its center than at its periphery to improve etching on the slice.

In order to enhance the uniformity of laminated film etching in plasma processing apparatus, there is disclosed in U.S. Pat. No. 5,246,532 by T. Ishida, which issued on Sep. 21, 1993, a focus ring surrounding a substrate to be processed, the height of the focus ring relative to the substrate being controlled by an electromagnet.

U.S. Pat. No. 5,271,788 by M. Hasegawa et al, which issued on Dec. 21, 1993, discloses magnetron plasma etching apparatus for improving uniformity of etching of a wafer including a low resistance carbon ring having an outer diameter larger than the diameter of the wafer disposed on a susceptor of the apparatus, the low resistance carbon ring being electrically connected to the susceptor.

U.S. Pat. No. 4,512,841 by G. F. Cunningham et al, issued on Apr. 23, 1985, discloses a batch type, parallel plasma etcher for providing improved etching by compensating for the plasma field or chamber abnormalities by using different wafer holders suitable for insertion in a common electrode of the etcher.

DISCLOSURE OF THE INVENTION

It is an object of this invention to provide a uniform gas flow across the surface of a device in a processing system having a chamber with one or more asymmetrically arranged elements therein.

In accordance with the teachings of this invention, a baffle arrangement is provided in a chamber of a gas flow processing system having asymmetrically positioned elements therein to uniformly distribute the gas flow across a major surface of a device being processed in the chamber. More particularly, a reactive ion etching system having asymmetrically positioned elements therein for etching one or more thin layers formed on the surface of a semiconductor wafer is provided with a baffle arrangement which causes gas flowing through the system to be uniformly distributed over the entire surface of the wafer.

The foregoing and other objects, features and advantages of this invention will be apparent from the preferred embodiments of the invention, as illustrated in the accompanying drawings.

BEST MODE FOR CARRYING OUT THE INVENTION

Figure 1:
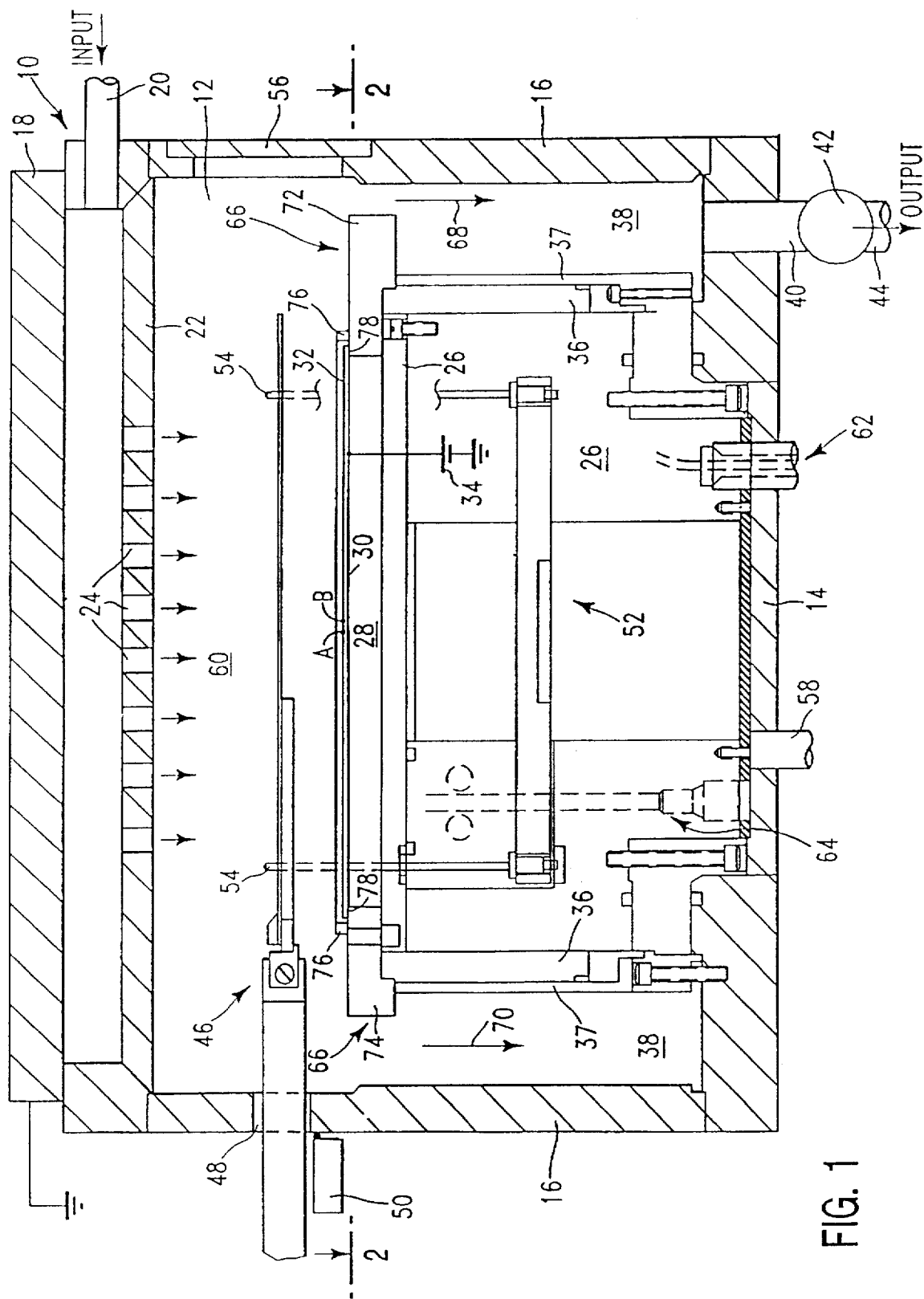
FIG. 1 is a sectional view of a gas flow system arranged in accordance with the teachings of the present invention.

Referring to FIG. 1 of the drawings in more detail, there is illustrated in a sectional view one embodiment of a gas flow system 10 in accordance with the teachings of the present invention. The system 10 includes a chamber 12 having a base plate 14, a cylindrical sidewall 16 and a top lid 18. A processing or reactive gas input or inlet 20 having a manifold 22 with a plurality of apertures 24, centrally disposed with respect to the cylindrical sidewall 16 and extending laterally about six inches, is disposed between the sidewall 16 and the top lid 18 of the chamber 12. The chamber base plate 14, the sidewall 16, the top lid 18 and the manifold 20 are preferably made of aluminum and are connected to electrical ground. A cathode 26, also preferably made of aluminum, is disposed on but insulated from the base plate 14, and a pedestal 28, which preferably has an anodized surface, located on the cathode 26 supports an electrostatic chuck 30 which in turn supports a semiconductor wafer 32. The electrostatic chuck 30 includes laminated layers of polyimide/copper/polyimide (not shown). A positive voltage from a voltage source, such as a battery 34, is applied to the copper layer of the electrostatic chuck 30 to firmly hold the wafer 32 on the pedestal 28 by appropriately charging chuck 30. A cylindrical quartz wall 36 surrounds the cathode 26. An anodized aluminum external cover 37 surrounding the quartz wall 36 defines a passageway 38 with the cylindrical sidewall 16 of the chamber 12 through which processing gases flow from the gas input 20 to a pump port 40 located on the right side of the chamber 12. A pump 42 discharges the processing gas from the pump port 40 to a processing gas output 44.

A wafer handler 46 carries the wafer 32 into and out of the chamber 12 through a slit 48 located in the sidewall 16 on the left side of the chamber 12. A hinged slit valve 50 is provided to close the chamber 12 when the wafer handler 46 is withdrawn. A wafer lift mechanism 52 is provided to transfer the wafer 32 from the wafer handler 46 to the electrostatic chuck 30 prior to processing and from the electrostatic chuck 30 to the wafer handler 46 after the processing is completed, with the wafer riding on the lift pins 54 of the wafer lift mechanism 52. Although only two lift pins 54 are indicated in FIG. 1, the wafer lift mechanism 52 is generally provided with four lift pins. The wafer lift mechanism 52 is driven by any appropriate motor (not shown). A quartz window 56 for viewing the interior of the chamber 12 is provided in the chamber sidewall 16 opposite the slit 48.

An R.F. system 58 is connected to the cathode 26 to produce a plasma region 60 between the pedestal 28 and the gas input 20. A water cooling system indicated in part at 62 is provided for cooling the cathode 26 and a helium cooling system indicated in part at 64 is provided for cooling the wafer 32.

It should be understood that the gas flow system 10 described hereinabove is generally known and is of a standard type used in the semiconductor processing industry.

Figure 2:
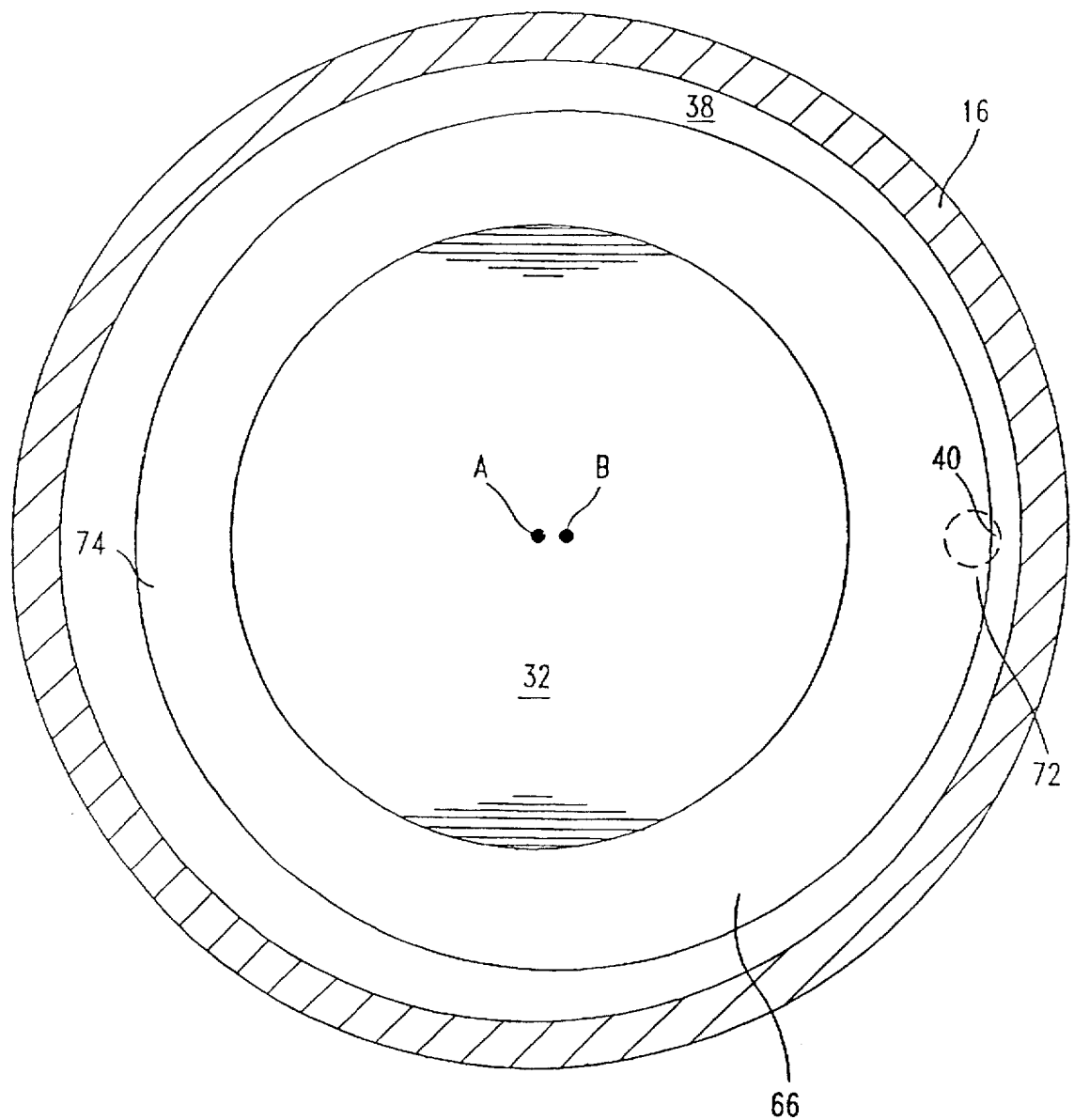
FIG. 2 is a top view of the gas flow system of FIG. 1 taken through section 2—2 thereof illustrating the relationship between a wafer contained in a chamber of the system and a collar surrounding the wafer, the chamber having a cylindrical interior wall.

In accordance with the teachings of the present invention, a collar 66, preferably made of quartz, is provided to surround the electrostatic chuck 30 and the wafer 32, as seen more clearly in FIG. 2 of the drawings. Refering back to FIG. 1, it should be noted that without the use of the collar 66, the reactive gas, e.g., fluorine, flowing through the passageway 38 along the right side of the chamber 12 and indicated by arrow 68 moves at a faster rate than does the gas flowing through the passageway 38 along the left side of the chamber and indicated by arrow 70 since the flow 68 is in a more direct path between the manifold apertures 24 of the gas input 20 where the gas enters the chamber 12 and the pump port 40. The faster gas flow 68 which is near the right side of the wafer 32 produces a faster etch rate on the right side of the wafer 32 than is experienced on any other part of the wafer 32. Accordingly, when a uniformly deposited thin layer of, e.g., polysilicon disposed over a thin silicon nitride layer on the wafer 32, is being selectively etched by a reactive ion etch process, the polysilicon on the right side of the wafer 32 etches at a faster rate than does the polysilicon on other parts of the wafer 32. This uneven etch rate produces undesirable results in the thin polysilicon layer and also adversely affects the lower thin silicon nitride layer.

As shown in FIG. 1, the collar 66 is provided with a base 78, which is located below wafer 32 during processing, and surrounds the bottom peripheral edge of wafer 32. Although base 78 is positioned adjacent to the bottom peripheral edge of wafer 32 in the preferred embodiment, base 78 does not actually touch that bottom peripheral edge because pedestal 28 actually supports wafer 32 slightly above base 78. Semiconductor wafers are flat, generally circular disks; however, since they typically include a small straight edge for reference purposes, they are not perfectly circular. In the preferred embodiment, therefore, base 78 is generally circular so that it surrounds the bottom peripheral edge of wafer 32. In other embodiments of the invention base 78 could be aligned with the top surface of pedestal 28 such that the bottom side of wafer 32 is physically contacted and supported by both the top side of pedestal 28 and base 78, as shown in FIG. 1. In such an embodiment, base 78 would again surround the bottom peripheral edge of wafer 32. Accordingly, for purposes of this patent, the term "surrounding accommodation" shall mean the surrounding of the peripheral edge of wafer 32 by base 78 in the instance in which base 78 does not physically contact wafer 32, as well as when it does physically contact wafer 32.

Collar 66 is further provided with a laterally extended portion 72 located over the pump port 40 which is significantly greater than the extension of a portion 74 on the left side of the collar 66. This extended portion 72 of the collar 66 causes a decrease in the flow rate of the gas along the right side of the chamber indicated by arrow 68 so as to equal the flow rate of the gas flow 70 in the passageway 38 at the left side of the chamber 12. This even flow of gas on both the right and left sides of the chamber 12 produces an even flow of gas along the entire surface of the wafer 32 to provide a uniform etch rate along the entire surface of the wafer 32. To further enhance the uniformity of the etch rate, a focus ring 76 may be provided on the upper surface of the collar 66. Since the wafer handler 46 moves between the gas inlet 20 and the focus ring 76, the focus ring 76 cannot have a high profile without substantially increasing the size of the chamber 12. However, by forming the focus ring on the collar 66 of the present invention, a high profile focus ring need not be used to provide desired uniform etching results.

To better understand the relationships among the elements of the present invention, reference may be had to FIG. 2 of the drawings which illustrates a top view of FIG. 1 taken through line 2—2 thereof wherein like reference characters refer to similar elements found in FIG. 1. As can be seen in FIGS. 1 and 2, the chamber sidewall 16 has a center line through point A. Additionally, wafer 32 and base 78 both have their center point on the center line going through point A. The collar 66, however, has its center point located at point B which is displaced a distance of e.g., ¼ inch from point A in the direction of the pump port 40. Thus the lateral edges of collar 66 are asymetrically disposed relative to the center point of base 78 and wafer 32, when wafer 32 is positioned over base 78 for processing. Also, it should be noted that the passageway 38 between the collar 66 and the cylindrical interior wall 16 of the chamber 12 on the right side of the chamber 12 above the pump port 40 is considerably reduced compared with the size of the passageway on the left side of the chamber 12 due to the offset of the collar 66. The extended portion 72 of the collar 66 is positioned so that the gas flow along arrow 68, indicated in FIG. 1, is equal to the gas flow along arrow 70 to provide uniform gas flow throughout the passageway 38, and, thus, a uniform etch rate at the surface of the wafer 32. Desired results have been obtained in a chamber having an internal diameter of approximately 13 inches with a collar having a diameter of 11.75 inches and an offset of ¼ inch when processing a silicon wafer having a diameter of eight inches.

Figure 3:
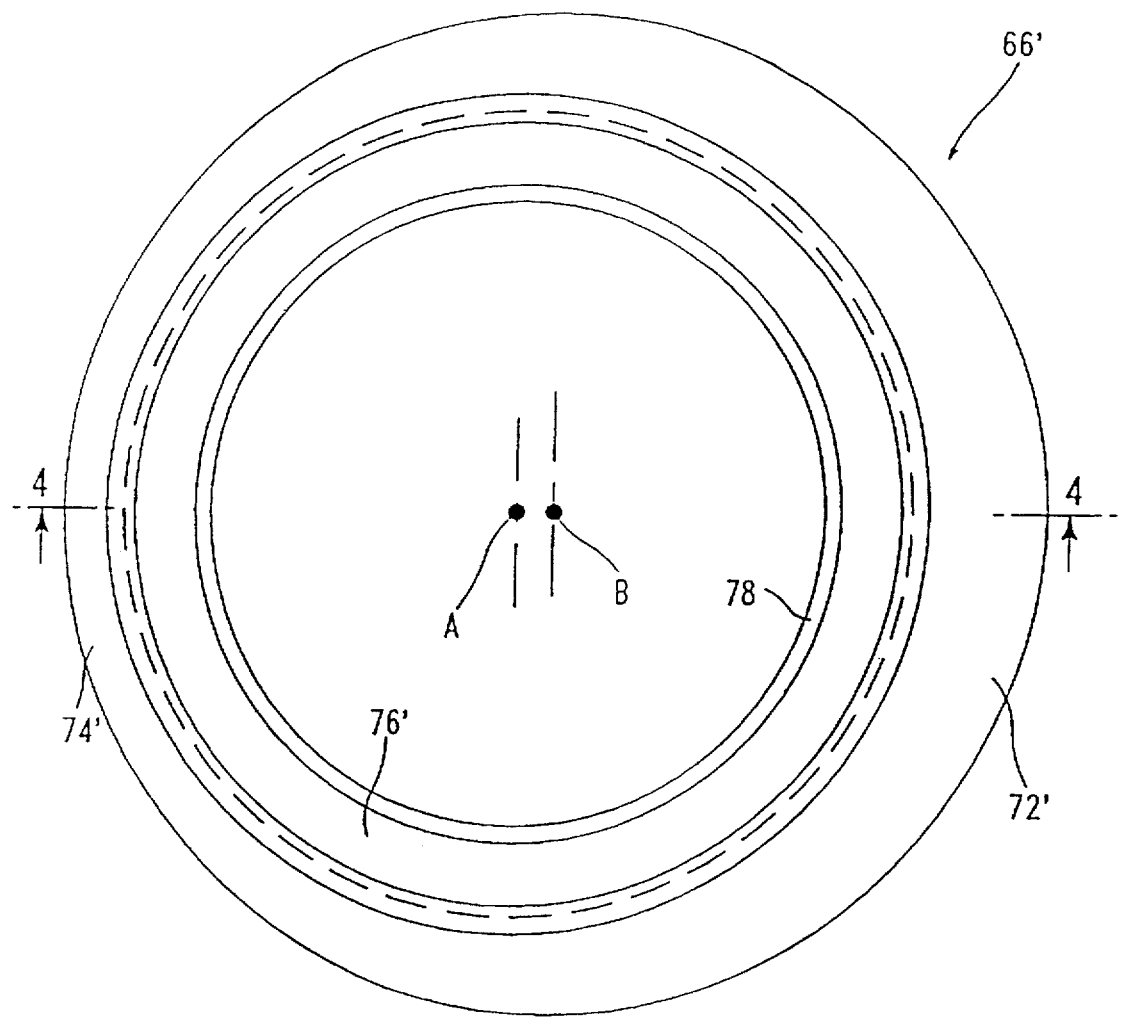
FIG. 3 illustrates the top view of a collar of the present invention similar to that shown in FIGS. 1 and 2 in more detail.
Figure 4:
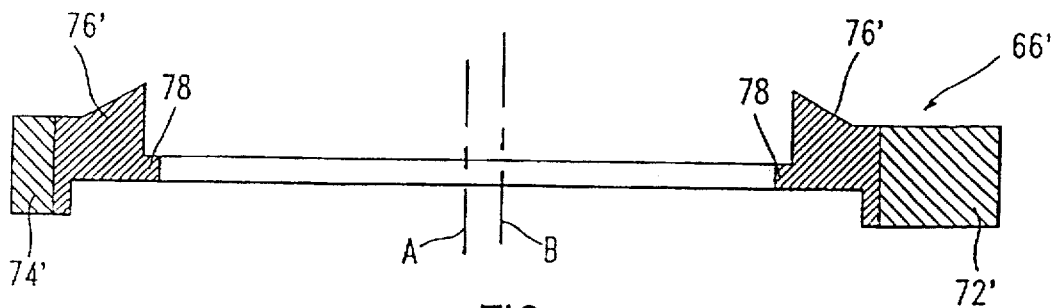
FIG. 4 is a sectional view of the collar illustrated in FIG. 3 taken through section 4—4 thereof.

FIGS. 3 and 4 illustrate in somewhat more detail a collar 66' that may be used in the practice of the present invention. FIG. 3 is a top view of the collar 66' similar to that of the collar 66 shown in FIGS. 1 and 2 of the drawings, and FIG. 4 is a sectional view of the collar 66' illustrated in FIG. 3 taken through line 4—4 thereof. As can be seen, particularly in FIG. 4, the collar 66' includes base 78 which surroundingly accommodates wafer 32 during the processing thereof and collar 66' further includes a focus ring 76' for further enhancing the uniformity of the gas distribution over the surface of the wafer. Focus rings have been known and used in an attempt to provide a uniform gas distribution along the surface of a wafer, however, it should be noted that in order to be effective such focus rings must have a relatively high profile, i.e., extend a considerable distance above the surface of the wafer and, therefore, require a very large plasma region, and, thus, a large chamber in order to provide adequate clearance space between the top of the focus ring and the top of the chamber for a wafer handler to move in and out of the chamber in a lateral direction. In the present invention with the use of the collar acting as a baffle over the pump port, a short focus ring may be used which does not significantly increase the size of the plasma region or the size of the gas chamber. Referring to FIGS. 3 and 4 again, it can be seen that point A is at the center of the focus ring 76' and point B is at the center of the periphery of the collar 66'. Also, it should be noted that the collar 66' may be conveniently fabricated from one piece of quartz.

Accordingly, it can be seen that an improved uniform gas flow arrangement has been provided in accordance with the teachings of this invention by controlling gas flow in a processing chamber having irregularities therein resulting in uniform etching of a semiconductor wafer across its entire exposed major surface. This uniform gas flow arrangement requires merely the use of a collar surrounding the wafer appropriately positioned with respect to a cylindrical inner sidewall of the chamber. The collar of the present invention may be used to provide uniform gas flow on an entire surface of a device in many different types of gas flow chambers having irregularities or abnormalities therein.

It should be understood that the collar of the present invention having lateral extensions to compensate for chamber irregularities or abnormalities in a gas flow system may have different configurations with varying offsets, varying outer diameters, combinations of extended collars, combination of extended collar with varying focus ring heights and rotating offset extended collars and may be made of different types of materials. Thus, it can be seen that by merely extending and offsetting the outer diameter of a collar around a chuck holding a semiconductor wafer, etch non-uniformities due to, e.g., chamber pumping asymmetries are minimized and wafer edge erosion is eliminated in etching processes. The use of the offset extended collars in accordance with the teachings of this invention to minimize or eliminate etch non-uniformity does not require extensive additional hardware and is easily and inexpensively retrofitable in many different types of etch chambers.

While the invention has been particularly shown and described with reference to preferred embodiments thereof, it will be understood by those skilled in the art that various changes in form and detail may be made therein without departing from the spirit and scope of the invention.

What is claimed is:

1. A method of processing a wafer comprising the steps of:

(a) providing a processing chamber having a chamber centerline;

(b) providing a wafer having a wafer center point, wherein the wafer center point generally intersects the chamber center line;

(c) mounting said wafer to a collar having first and second laterally extended portions that are asymmetrically disposed to said wafer center point and said chamber center line; and (d) processing said wafer mounted to said collar in said processing chamber.

2. The method as recited in claim 1, wherein said processing chamber is cylindrically shaped.

3. The method as recited in claim 2, wherein said processing chamber includes a gas inlet port which is symmetrically disposed relative to said center line and a gas outlet port which is asymetrically disposed relative to said center line.

4. The method as recited in claim 3, wherein said collar is ring shaped.

5. The method as recited in claim 3, further comprising the step of matching said asymmetry of said first and second lateral extendied portions of said collar with natural asymmetry of gas flow in said chamber due to said asymmetrical positioning of said gas outlet port to create a uniform flow of gas over said surface of said wafer during said processing step (d).

6. A method of processing a wafer comprising the steps of:

(a) providing a generally cylindrical chamber having a center line, a gas port asymmetrically disposed about said chamber center line, a base for holding a wafer generally centered on said chamber center line, and an element in said chamber, said element having laterally extending portions asymmetrically disposed relative to said center line as measured perpendicular to said center line to provide uniform gas flow in said chamber;

(b) mounting a wafer to said base; and (c) processing said wafer in said chamber.

7. A method as recited in claim 6, wherein said gas port is a gas outlet port.

8. A method as recited in claim 6, wherein said laterally extending portions are part of a collar for said base.

9. A method as recited in claim 8, wherein said base is adapted for accommodating a generally circular wafer.

10. A method as recited in claim 8, wherein said collar is circular and has a center point spaced from said chamber center line.

* * * * *